(12) United States Patent  (10) Patent No.: US 8,083,960 B2
Uchida et al.  (45) Date of Patent: Dec. 27, 2011

(54) ETCHING ENDPOINT DETERMINATION METHOD

(75) Inventors: Hiroshige Uchida, Kudamatsu (JP); Daisuke Shiraishi, Hikari (JP); Shoji Ikuhara, Hikari (JP); Akira Kagoshima, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 806 days.

(21) Appl. No.: 12/189,883

(22) Filed: Aug. 12, 2008

(65) Prior Publication Data

US 2009/0211706 A1    Aug. 27, 2009

(30) Foreign Application Priority Data

Feb. 27, 2008  (JP) ................. 2008-046533

(51) Int. Cl.
*H01L 21/302* (2006.01)
(52) U.S. Cl. ............................. 216/60; 438/9
(58) Field of Classification Search ............... None
See application file for complete search history.

(56) References Cited

U.S. PATENT DOCUMENTS 5,362,356 A * 11/1994 Schoenborn ............ 216/60
6,297,064 B1 * 10/2001 Koshimizu ............... 438/9

FOREIGN PATENT DOCUMENTS

| JP | 63093115 A | * | 4/1988 |
| JP | 03181129 A | * | 8/1991 |
| JP | 2004-079727 | | 3/2004 |

* cited by examiner

*Primary Examiner* — Anita Alanko
(74) *Attorney, Agent, or Firm* — Antonelli, Terry, Stout & Kraus, LLP.

(57) ABSTRACT

A microscopic change in a luminous intensity occurring near an etching endpoint is accurately detected, whereby the endpoint of etching is quickly determined. An etching endpoint determination method for determining an endpoint of etching processing in a plasma etching apparatus that introduces a processing gas into a vacuum chamber, produces plasma by feeding high-frequency energy to a introduced processing gas, and uses the produced plasma to perform plasma processing on a workpiece stored in the chamber includes: a step of sampling light of a pre-set wavelength from light emitted by the plasma produced in the vacuum chamber, acquiring as time-sequential data the luminous intensity of the sampled light of the specific wavelength, and computing a regression line on the basis of the acquired time-sequential data; and a step of computing distances in a time-base direction between the regression line and the time-sequential data which are obtained at the first step. An endpoint of etching processing is determined based in the distances in the time-base direction obtained at the second step.

3 Claims, 8 Drawing Sheets

ETCHING ENDPOINT DETERMINATION METHOD

BACKGROUND OF THE INVENTION

1. Field of the Invention

The present invention relates to an etching endpoint determination method, or more particularly, to an etching endpoint determination method making it possible to highly precisely determine an endpoint of etching processing to be performed by utilizing plasma discharge.

2. Description of the Related Art

In dry etching processing of a semiconductor wafer, the luminous intensity of light of a specific wavelength under plasma light emission changes along with the progress of etching of a specific film. The change in the luminous intensity of the light of the specific wavelength under plasma light emission is detected during the etching processing of the semiconductor wafer. Based on the result of the detection, an etching endpoint for the specific film can be detected.

For example, Japanese Patent Application Laid-Open Publication No. 2004-79727 reads that: a plasma-emitted light signal to be generated in an etching apparatus during etching of a material to be etched is acquired; and a linear model or a nonlinear model expressed by a polynomial expression is obtained for the acquired signal. Thereafter, an error of the signal from a calculated value represented by the obtained model is worked out. When the temporal change rate of the error exceeds a predetermined threshold value, the time point is detected as an endpoint of etching.

SUMMARY OF THE INVENTION

In recent years, an aperture ratio (a ratio of an area to be etched to the area of a semiconductor wafer) has diminished along with a tendency to a microscopic working dimension and high-density integration in a semiconductor wafer. Consequently, a change in a luminous intensity produced by plasma near an etching endpoint is microscopic. Moreover, the precision in a working dimension to be attained through etching is more and more severely requested.

In recent years, an aperture ratio (a ratio of an area to be etched to the area of a semiconductor wafer) has diminished along with a tendency to a microscopic working dimension and high-density integration in a semiconductor wafer. Consequently, a change in a luminous intensity produced by plasma near an etching endpoint is microscopic. Moreover, the precision in a working dimension to be attained through etching is more and more severely requested.

For example, in determination of an endpoint of etching, in case an endpoint determination time lags only several seconds, a film underlying a film that should be etched is excessively etched. A disorder in a working dimension takes place or side etching (excessive etching in a lateral direction) is carried out. Consequently, a workpiece shape deteriorates.

In order to avoid the dimensional disorder or the deterioration of a shape, a microscopic change in a luminous intensity occurring near an etching endpoint has to be accurately detected in an early stage, and processing has to proceed to the next step of removing the residue of a film to be etched which is called an over-etching step.

When a change in a luminous intensity becomes microscopic, if the change in a luminous intensity is detected using, for example, a linear model expressed by a polynomial expression, the change in a luminous intensity is detected with an error occurring in a direction of a signal component. Therefore, when the aperture ratio is low, the detection is susceptible to a noise component contained in a signal. It is hard to detect an etching endpoint accurately in an early stage.

The present invention is intended to address the foregoing problem, and to provide an etching endpoint determination technology making it possible to determine an etching endpoint by detecting the etching endpoint accurately in an early stage.

In order to solve the foregoing problem, the present invention adopts a means described below.

An etching endpoint determination method for determining an endpoint of etching processing which is implemented in a plasma etching apparatus that introduces a processing gas to a vacuum processing chamber via a gas introduction means, produces plasma by feeding high-frequency energy to the introduced processing gas, and uses the produced plasma to perform plasma processing on a workpiece stored in the processing chamber includes: a step of sampling light of a pre-set wavelength from light emitted by the plasma produced in the vacuum processing chamber, acquiring the luminous intensity of the sampled light of the specific wavelength as time-sequential data, and computing a regression line on the basis of the acquired time-sequential data; and a step of computing distances in a time-base direction between the regression line and the time-sequential data which are obtained at the first step. An endpoint of etching processing is determined based on the distances in the time-base direction obtained at the second step.

The present invention has the foregoing constitution, and can therefore provide an etching endpoint determination technology making it possible to determine an etching endpoint by detecting the etching endpoint accurately in an early stage.

BRIEF DESCRIPTION OF THE DRAWINGS

Embodiments of the present invention will be described in detail with reference to the following figures, wherein.

DESCRIPTION OF THE PREFERRED EMBODIMENTS

Figure 1:
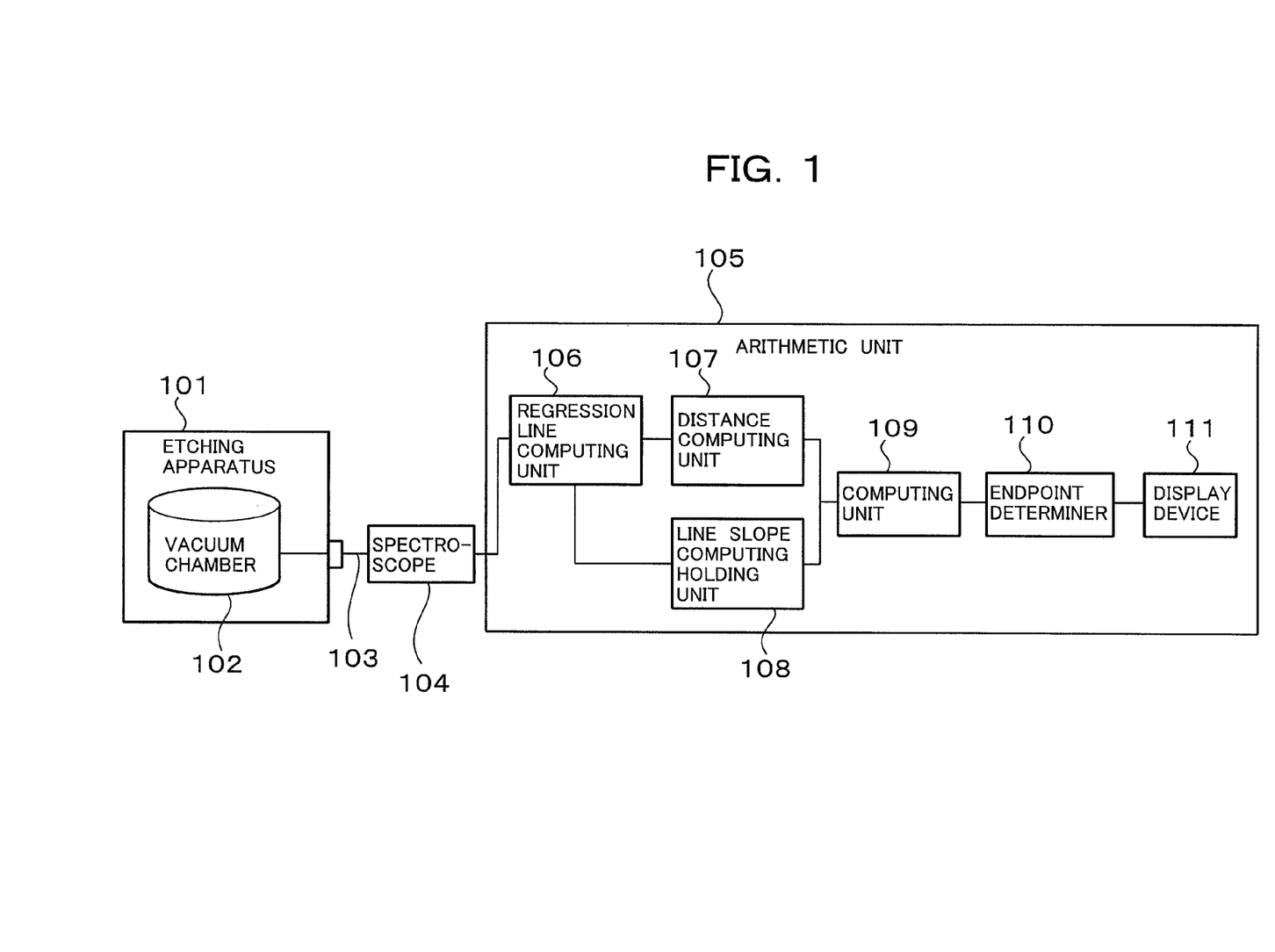
FIG. 1 is an explanatory diagram showing an etching endpoint determination system in accordance with an embodiment.

Referring to the appended drawings, the best embodiment will be described below. FIG. 1 is an explanatory diagram showing an etching endpoint determination system in accordance with the present embodiment. An etching apparatus 101 includes a vacuum chamber 102. An etching gas is introduced into the vacuum chamber 102 via a gas introduction means that is not shown. Microwave power or the like is fed to the introduced etching gas in order to decompose the etching gas so as to produce plasma. The plasma is used to perform etching processing on a sample such as a wafer stored in the vacuum chamber.

A spectroscope is used to measure the spectrum of light of a specific wavelength emitted by plasma generated in the vacuum chamber during etching processing, and the signal component of the specific wavelength acquired through the spectral measurement is fetched into an arithmetic unit 105. The arithmetic unit 105 is formed with, for example, a personal computer (PC).

The fetched signal is used to deduce a regression line expression by a regression line computing unit 106. Preferably, the fetched signal has the gain thereof processed (has the signal intensity thereof amplified or decayed) for the purpose of enhancing a change in a time-base direction.

Thereafter, a distance computing unit 107 computes a distance between each of signals, which range from the latest signal to a signal having been obtained at a certain past time point, and a regression line obtained through computation (expressed by the regression line expression).

The number of signals to be employed in the computation can be set to an arbitrary value. Moreover, a line slope computing holding unit 108 that holds the value of the slope of the calculated regression line and a computing unit 109 are included. The computing unit 109 computes the value (distance) obtained by the distance computing unit 107 and the value (slope) held in the line slope computing holding unit so as to work out a component in a temporal direction of the distance. An endpoint determiner 110 monitors the result of the computation by the computing unit 109. When the result of the computation exceeds a pre-set criterial level, the endpoint determiner 110 outputs an endpoint criterial signal. The endpoint criterial signal is displayed on a display device 111.

Figure 2:
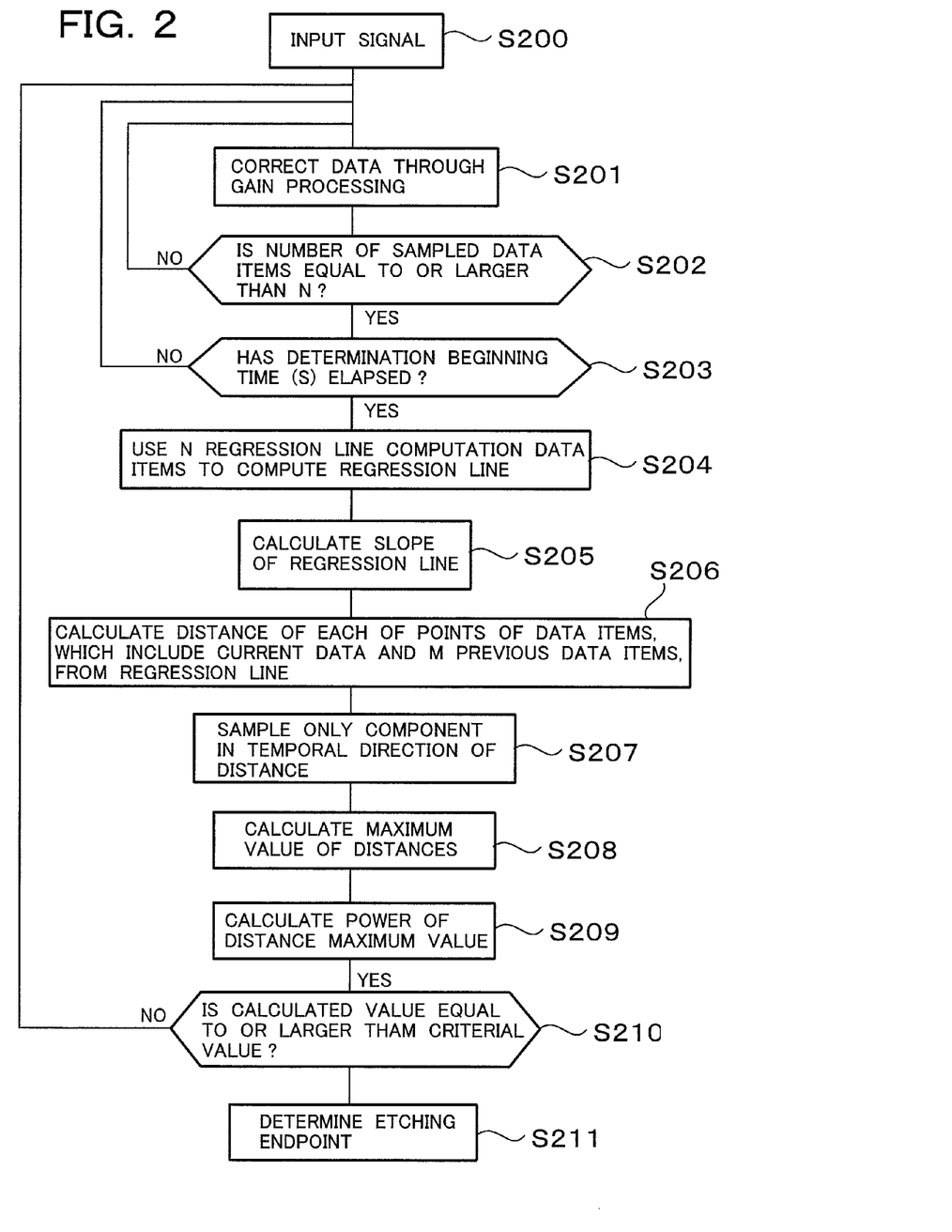
FIG. 2 is an explanatory diagram describing processing to be performed by an arithmetic unit 105 that computes an endpoint of etching.

FIG. 2 is an explanatory diagram describing processing to be performed by the arithmetic unit 105 that computes an endpoint of etching. To begin with, the spectroscope is used to sample as time-sequential data light of a specific wavelength from light emitted by plasma stemming from etching processing, and the sampled data is inputted to the arithmetic unit 105 (step S200).

The inputted time-sequential data is subjected to gain processing by a gain computing unit. In the gain processing, a signal waveform is reduced, that is, multiplied by, for example, 0.001 so that the signal waveform can markedly represent a change in a component in a time-base direction. Incidentally, the number of signal points for the data has to be larger than the number of signal points to be used to obtain a regression line and the number of distance computation signals needed to obtain distances from the regression line (step S201).

After the number of obtained signals becomes equal to or larger than a required number of signals, when a predetermined determination beginning time has elapsed, computing processing of obtaining a regression line is performed. The computation of obtaining the regression line is performed according to, for example, a least squares method. Moreover, the signals to be used for the computation of obtaining the regression line range from the latest signal to a signal acquired at an arbitrary past time point. Data of the slope of the obtained regression line is held in the regression line slope computing holding unit 108 (steps S202, S203, S204, and S205).

Thereafter, the obtained regression line is used to calculate the distance from each of the points of the signals having been acquired in the past. The signals to be used to calculate the distance range from the latest signal to a signal acquired at an arbitrary past time point. The number of signal points to be employed, M, is larger than, for example, the number of signal points used to compute the regression line.

Moreover, the distance d from the regression line to a certain past point can be obtained according to an equation 2 on the assumption that the regression line is expressed by an equation 1. In the equation 2, x1 and y1 denote an x-coordinate and a y-coordinate representing the certain past point.

$$y = a*t + b \quad (1)$$

$$d = \frac{|y1 - a*t1 - b|}{\sqrt{1 + a^2}} \quad (2)$$

Assuming that the axis of abscissas is a time base and the axis of ordinates represents signal intensities, the distance given by the equation 2 contains both of components of a time and a signal intensity (step S206).

A signal acquired from plasma stemming from etching processing contains a noise component, and the noise component is expressed as a signal-intensity component on the axis of ordinates. Consequently, when only components dx in the time-base direction are sampled from a signal obtained through distance computation, an adverse effect by the noise component can be minimized. Incidentally, each of the components dx in the time-base direction of distances from the regression line can be calculated according to an equation 3.

$$dt = \frac{|a*(y1 - a*t1 - b)|}{1 + a^2} \quad (3)$$

The calculating processing of a component in the time-base direction, dx, of a distance from the regression line is performed on all of arbitrarily designated distance calculation signal points M (step S207).

Thereafter, power computation is performed on a maximum value (distance maximum value) among components in the time-base direction of distances of all signal points from the regression line. As for the computing method, for example, an inputted signal is squared. If the computed value exceeds an arbitrarily designated threshold, the signal point is determined as an endpoint (steps S209 and S210). By performing the power computation, a signal component can be further amplified and noise contained in a signal can be reduced.

Figure 3:
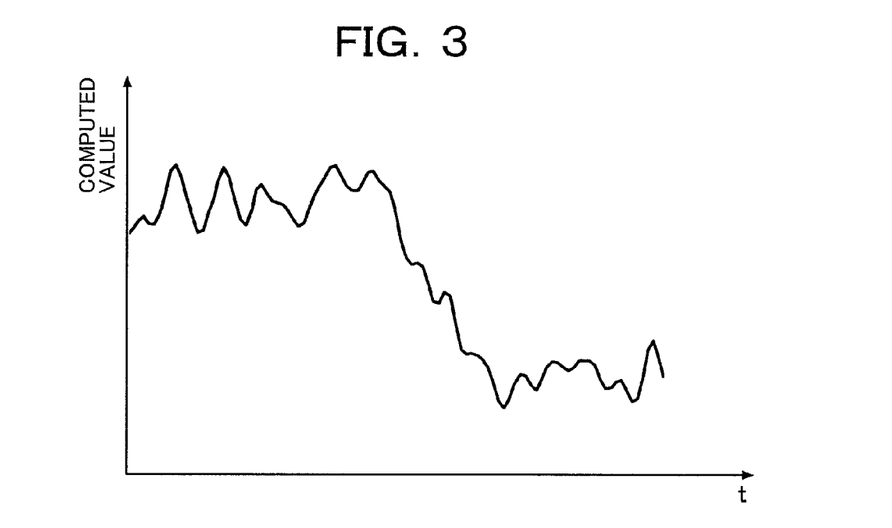
FIG. 3 shows a light signal of a specific wavelength out of light emitted by plasma produced during etching processing.

FIG. 3 shows an example of a light signal of a specific wavelength out of light emitted by plasma stemming from etching processing. In the waveform of the light signal, since many fluctuations of the signal that are thought to be noise components derived from an aperture ratio are expressed, it is hard to grasp a change in the waveform occurring along with the progress of etching.

Figure 4:
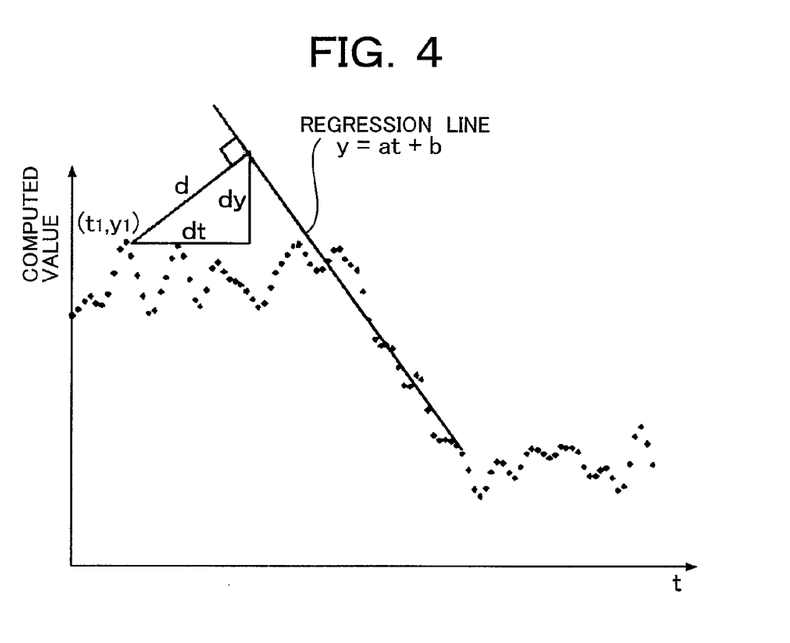
FIG. 4 is an explanatory diagram showing a regression line.

FIG. 4 is an explanatory diagram concerning a regression line. The regression line is obtained using, for example, the latest signal point and several tens of past signal points on the waveform of a light signal. The number of signal points to be used to calculate the regression line can be set to an arbitrary value, for example, to 20. Thereafter, the distance between the calculated regression line and each of the signal points is computed. The distance d between the regression line and each of the signal points is the length of a perpendicular extended from each signal point to the regression line. A component dt in the time-base direction of the distance is a signal needed to determine an endpoint.

Figure 5:
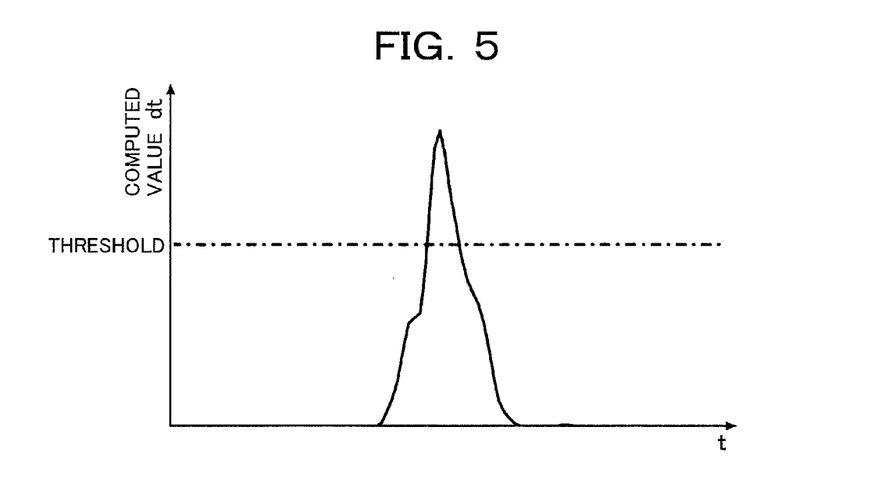
FIG. 5 shows a result of computation of a distance between the regression line and each of signal points.

FIG. 5 shows the result of computation of the distance dt between a regression line and each of signal points. Herein, an example of a waveform is shown on the assumption that the number of signal points to be used to calculate the regression line is 20 and the number of signal points to be used to obtain the distances is 100. An endpoint of etching is determined based on the obtained waveform. A threshold to be used for the determination can be set to an arbitrary value. Nevertheless, the threshold should be a value making it possible to accurately determine in an early stage a change occurring near an etching endpoint.

Figure 6:
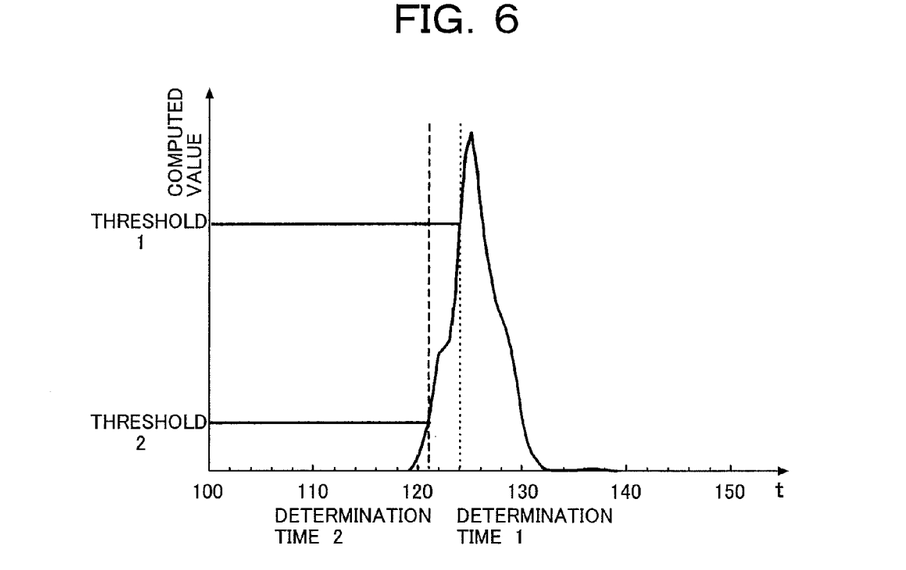
FIG. 6 is an explanatory diagram concerning a method of designating a threshold for the waveform shown in FIG. 5.

FIG. 6 is an explanatory diagram concerning a method of designating a threshold for the waveform shown in FIG. 5. A time difference of approximately 3 sec occurs in determination of an etching endpoint between a case where the threshold is set to a threshold 2 and a case where the threshold is set to a threshold 1. Specifically, when the threshold is set to the threshold 1, a lag of 3 sec occurs in the timing of determining the endpoint. In this case, at a certain point on the surface of a wafer, the etching endpoint elapses and a surface that must not be etched is damaged during the 3 sec.

The waveform shown in FIG. 5 is the waveform of a component in the time-base direction of the distance between the regression line and each of signal points. As mentioned above, the component in the time-base direction of the distance between the regression line and each of the signal points is little affected by noise in a signal. The threshold can therefore be set to the threshold 2 or a smaller value. Consequently, an endpoint can be detected in an early stage.

Incidentally, assuming that the distance between a regression line and each of signal points, that is, the length d of a perpendicular extended from each of the signal points to the regression line is designated as a signal to be used for determination, the signal representing the distance contains an intensity component. This makes it hard to lower the threshold to be used for the determination.

Figure 7:
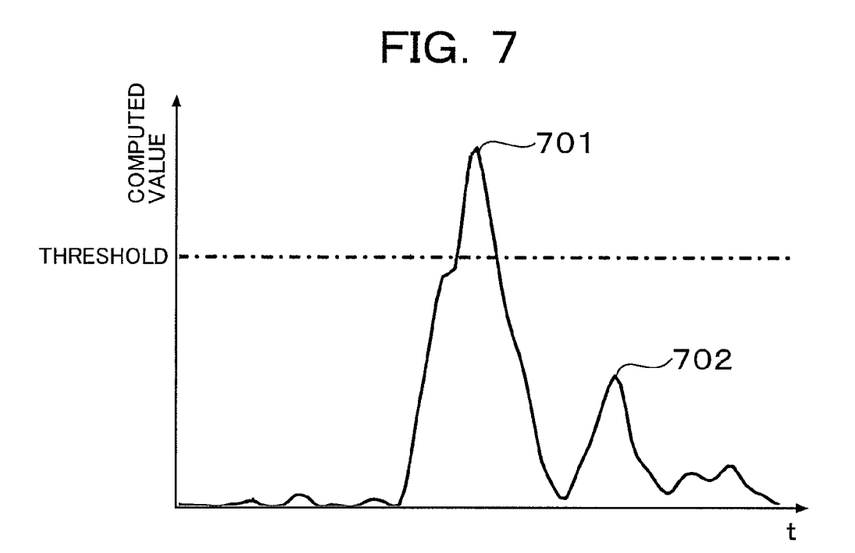
FIG. 7 shows a waveform of a component in a signal-intensity direction of the distance between the regression line and each of signal points.

FIG. 7 shows the waveform of a component dy in a signal-intensity direction of a distance between a regression line and each of signal points. Compared with the waveform shown in FIG. 5 and used to sample the component dt in the time-base direction of the distance from the regression line, the waveform shown in FIG. 7 demonstrates that a large amount of noise is contained in the signal. Moreover, another crest is observed at the trailing end of the waveform. The crest is observed because the waveform of a light signal has fallen. When the luminous intensity signal component is employed, the crest component cannot be removed.

For detection of an endpoint, determination may be performed late using, for example, the trailing part of a waveform. For example, at a step of detecting an endpoint in the course of etching, even when a residue or the like remains, if the etching should be continuously performed, it is effective to perform endpoint determination late. In this case, there is a fear that erroneous determination may be invited due to a signal component observed at the trailing end of the waveform. In contrast, when only components in the time-base direction are used, after a waveform has fallen, a noise component is hardly observed. The erroneous determination can be prevented.

Figure 8:
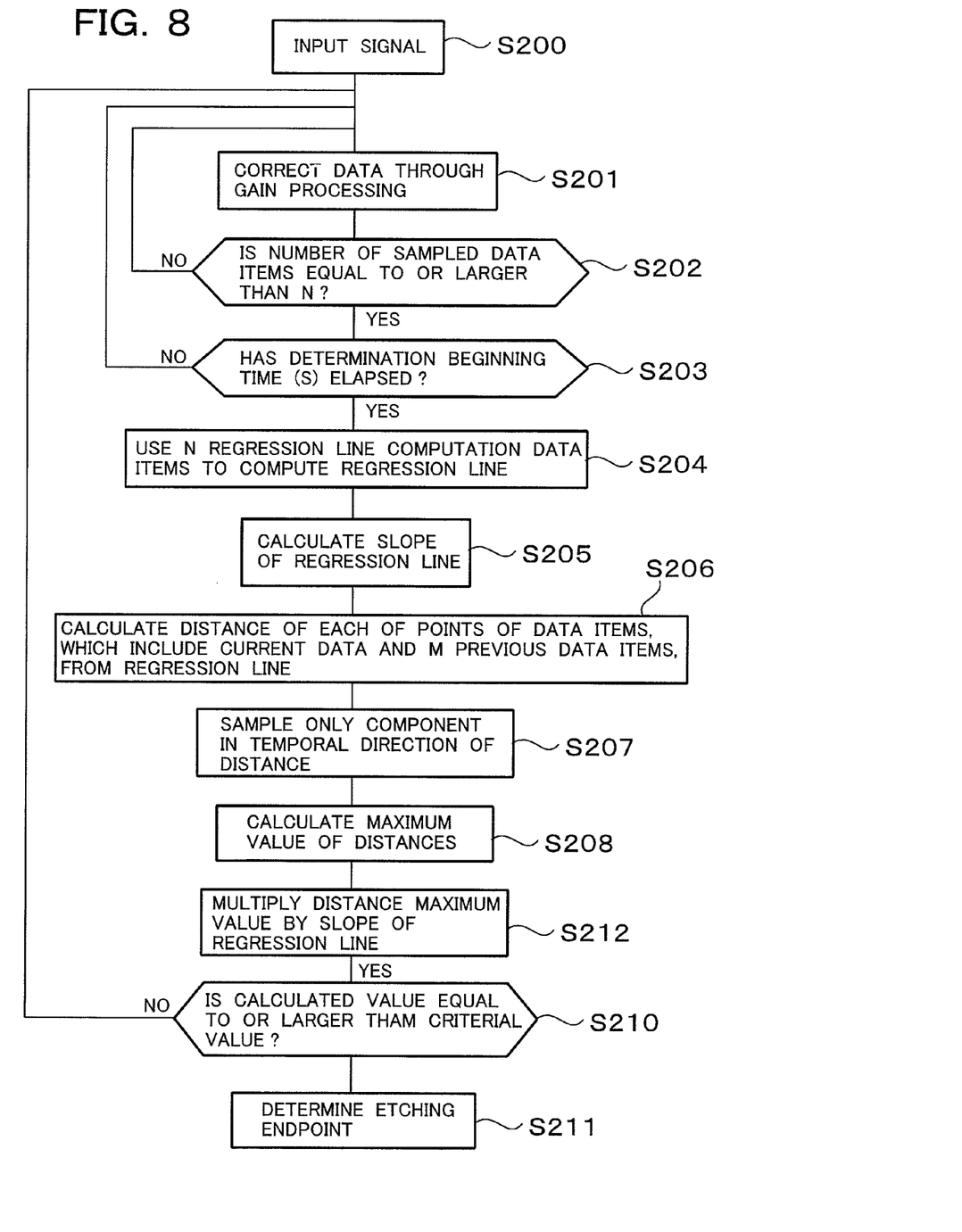
FIG. 8 is an explanatory diagram concerning the second embodiment.

FIG. 8 is an explanatory diagram concerning the second embodiment. In FIG. 8, processing from step S200 to step S208 is identical to the processing from step S200 to step S208 in FIG. 2. Therefore, the same reference numerals are assigned to the steps, and an iterative description will be omitted.

As described in FIG. 8, distances d of all signal points from a regression line are calculated. Thereafter, a maximum value (distance maximum value) among components dt in the time-base direction of the distances d from the regression line is calculated (steps S206, 207, and 208). Thereafter, each of the calculated components dt in the time-base direction of the distances is multiplied by the slope of the regression line (step S212). The result of the multiplication is compared with a predetermined threshold. If the result of the multiplication exceeds the threshold, an endpoint determination detection signal is outputted (step S210 and 211).

Figure 9:
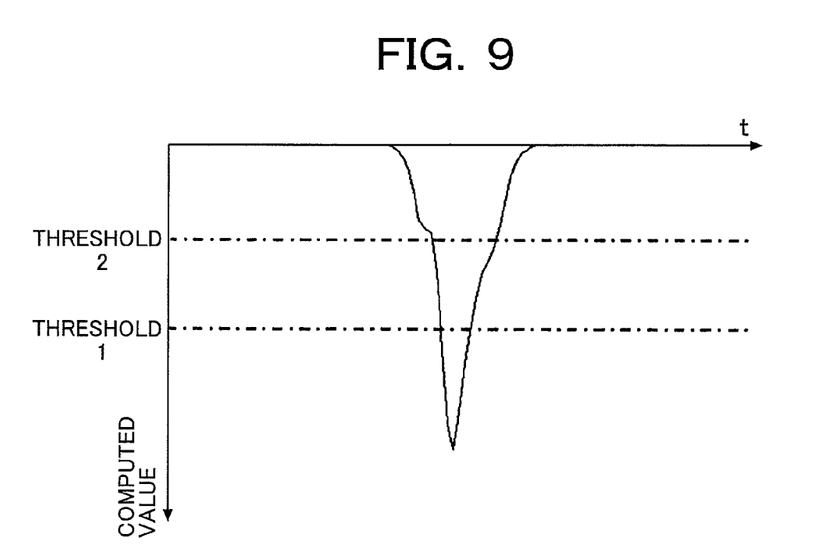
FIG. 9 shows a result of multiplication of a maximum value of a component in a time-base direction of a distance by the slope of a regression line.

FIG. 9 shows the result of the multiplication of the maximum value of the components in the time-base direction of the distances by the slope of the regression line. Even in this case, since only the components in the time-base direction are sampled, a noise component contained in a signal is seen to be small. Namely, even in the case of this waveform, when not only the threshold 1 is designated for determination but also the threshold is lowered to the threshold 2, the determination can be achieved in an earlier stage. Moreover, when the threshold is not lowered, an adverse effect of noise on a criterial signal to be used for determination can be reduced. The determination can be performed more stably.

Figure 10:
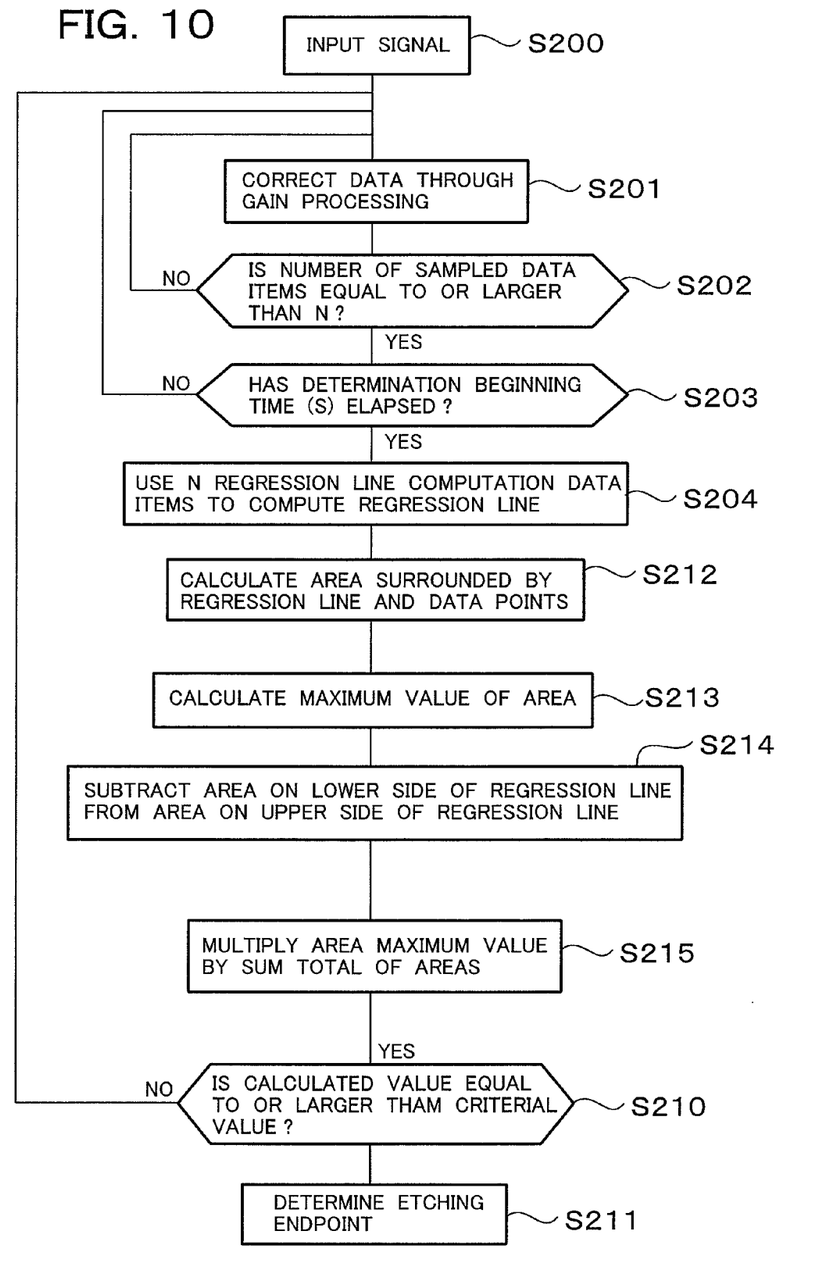
FIG. 10 is an explanatory diagram concerning the third embodiment.

FIG. 10 is an explanatory diagram concerning the third embodiment. In FIG. 10, step S201 to step S204 are identical to those of the first embodiment. A regression line is calculated from a plasma-emitted light signal, and an area on the upper side of the regression line within an area surrounded by the obtained regression line and the waveform of an acquired signal, and an area on the lower side of the regression line are calculated (step S212). Moreover, the maximum value of the entire area is stored (step S213). Thereafter, the ratio of the area on the upper side of the regression line within the entire area to the area on the lower side thereof is calculated. Herein, the fact that the difference between the area on the upper side of the regression line and the area on the lower side thereof is large is utilized for detection. Therefore, the difference between the areas may be calculated instead of the ratio. For example, one of the areas is subtracted from the other area in order to work out a computed value (step S214). Moreover, the maximum value of the entire area surrounded by the regression line is used and multiplied by the obtained computed value in order to work out a final criterial signal, and an endpoint is determined (step S215). The obtained final computed value is used as an endpoint criterial signal, and an endpoint of etching is determined.

Figure 11:
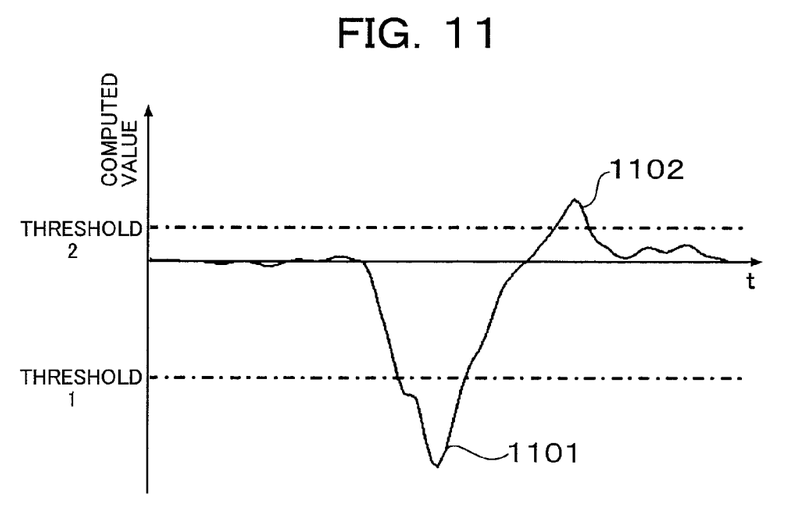
FIG. 11 shows a result of computation of the product of a difference between areas created above and below a regression line by a maximum value of an area enclosed by the regression line.

FIG. 11 shows the result of computation of the product of the difference between the areas on the upper and lower sides of the regression line by the maximum value of the area surrounded by the regression line. When the result of the computation is used for determination, since the computed value changes, for example, from a negative value to a positive value, the waveform has one crest 1101 oriented in a negative direction and one crest 1102 oriented in a positive direction. Therefore, for example, when late determination is performed, the point of inflection of the waveform is regarded as a point of a change from the negative direction to the positive direction. Assuming that determination is performed under a condition that the computed value exceeds a certain threshold 1 and then exceeds a threshold 2, since the sign of the computed value is reversed, the computed value is unsusceptible to noise. Consequently, the determination can be achieved stably. Moreover, similarly to the first and second embodiments, since a signal is little affected by noise, even early determination can be achieved highly precisely.

As described so far, according to the embodiments of the present invention, components in the time-base direction of distances between a regression line and respective signal points is used to determine an endpoint. Consequently, even when a signal produced from plasma stemming from etching processing contains a noise component, since the noise component is expressed as a signal-intensity component on the axis of ordinates, an adverse effect of the noise component can be minimized. Consequently, even when a change in the luminous intensity of light emitted by plasma is microscopic, the microscopic change in the luminous intensity occurring near an etching endpoint can be accurately detected in an early stage. Consequently, the endpoint of etching can be quickly and accurately determined. Moreover, when a waveform of a signal varies abruptly, since the slope of the waveform gets large, a criterial waveform little affected by a noise component can be obtained according to the second embodiment. Moreover, when determination is requested to be performed rather late, a point of inflection can be readily grasped by utilizing the third embodiment. Consequently, determination can be achieved stably. Thus, an appropriate one of the determination methods can be selected. Moreover, the precision in determination largely varies depending of whether the number of data items to be used to plot a regression line or the number of data items to be used to calculate distances is optimized. The precision in determination will drastically improve by adopting appropriate values in every determination.

What is claimed is:

1. An etching endpoint determination method for determining an endpoint of etching processing which is implemented in a plasma etching apparatus that introduces a processing gas into a vacuum processing chamber via a gas introduction means, produces plasma by feeding high-frequency energy to the introduced processing gas, and uses the produced plasma to perform plasma processing on a workpiece stored in the processing chamber, comprising the steps of:

sampling light of a pre-set wavelength from light emitted by the plasma produced in the vacuum processing chamber, acquiring as time-sequential data the luminous intensity of the sampled light of the specific wavelength, and computing a regression line on the basis of the acquired time-sequential data; and computing distances in a time-base direction between the regression line and the time-sequential data which are obtained at the first step, wherein an endpoint of etching processing is determined based on the distances in the time-base direction obtained at the second step.

2. An etching endpoint determination method for determining an endpoint of etching processing which is implemented in a plasma etching apparatus that introduces a processing gas into a vacuum processing chamber via a gas introduction means, produces plasma by feeding high-frequency energy to the introduced processing gas, and uses the produced plasma to perform plasma processing on a workpiece stored in the processing chamber, comprising the steps of:

sampling light of a pre-set wavelength from light emitted by the plasma produced in the vacuum processing chamber, acquiring as time-sequential data the luminous intensity of the sampled light of the specific wavelength, and computing a regression line on the basis of the acquired time-sequential data; and computing distances in a time-base direction between the regression line and the time-sequential data which are obtained at the first step, wherein an endpoint of etching processing is determined based on the distances in the time-base direction obtained at the second step and the slope of the regression line.

3. An etching endpoint determination method for determining an endpoint of etching processing which is implemented in a plasma etching apparatus that introduces a processing gas into a vacuum processing chamber via a gas introduction means, produces plasma by feeding high-frequency energy to the introduced processing gas, and uses the produced plasma to perform plasma processing on a workpiece stored in the processing chamber, comprising the step of:

sampling light of a pre-set wavelength from light emitted by the plasma produced in the vacuum processing chamber, acquiring as time-sequential data the luminous intensity of the sampled light of the specific wavelength, and computing a regression line on the basis of the acquired time-sequential data, wherein:

an endpoint of etching processing is determined based on the product of the maximum value of an area, which is surrounded by the regression line and the time-sequential data which are obtained at the step, by the difference between an area formed above the regression line and an area formed below the regression line.

* * * * *